United States Patent [19]

Carlson et al.

[11] Patent Number: 4,723,361
[45] Date of Patent: Feb. 9, 1988

[54] IC INSERTION/EXTRACTION TOOL

[75] Inventors: Robert L. Carlson, Chicago; Joseph G. Murglin, Norridge, both of Ill.

[73] Assignee: AT&T Teletype Corporation, Skokie, Ill.

[21] Appl. No.: 897,230

[22] Filed: Aug. 18, 1986

[51] Int. Cl.4 .......................... H05K 3/32; B25B 9/02; B25B 27/02; B25F 1/00
[52] U.S. Cl. .......................... 29/764; 29/741; 29/758
[58] Field of Search .......................... 29/741, 758, 764

[56] References Cited

U.S. PATENT DOCUMENTS

| | | | |
|---|---|---|---|
| 3,516,142 | 6/1970 | De Rose et al. | 29/758 X |
| 3,535,763 | 10/1970 | Helton | 29/741 |
| 4,141,138 | 2/1979 | Quick | 29/758 X |
| 4,172,317 | 10/1979 | Kober et al. | 29/741 X |
| 4,215,468 | 8/1980 | Greco | 29/758 X |

Primary Examiner—Howard N. Goldberg
Assistant Examiner—Taylor J. Ross
Attorney, Agent, or Firm—A. A. Tirva

[57] ABSTRACT

A tool for insertion and extraction of a packaged IC to and from a socket includes a pair of flexible, parallel arms joined at two ends by a "U" shaped portion. The free ends of the two when moved towards each other are adapted to grip the IC at opposite ends and allow a rocking motion to be applied to loosen the pins of the IC within the socket and then for a lifting force to be applied to remove the IC the socket, all with minimum distortion of the pins. A plunger having a base which is positioned and is free to move between the two parallel walls within the "U" is used to insert an IC into its socket. The IC is positioned between the two walls of the "U" with the pins of the IC pointing outwards and the surface opposite the pins in contact with the base of the plunger. The IC is retained within the "U" by a predetermined interference fit between the walls and the IC. The tool positions the IC over the socket and a downward force is applied to the plunger to push the IC out of the "U" portion and into the socket.

6 Claims, 6 Drawing Figures

IC INSERTION/EXTRACTION TOOL

TECHNICAL FIELD

This invention relates to a tool, and more particularly to a combination tool, for inserting and/or extracting integrated circuit (IC) packs into or from a socket or similar type of support.

BACKGROUND ART

Present day electronic equipment utilizes a great number of IC packs (packaged integrated circuit chips). Typically the IC packs are plugged into sockets mounted on printed circuit boards. The IC's are often removed and reinserted for a number of reasons such as testing, program changes, etc. A typical dual-in-line IC pack contains 24 to 40 pins, each pin being approximately 15 mm. wide and 36 to 50 mm. long. The pins of these IC's are very fragile and may easily be bent or deformed during the IC removal or insertion process. Thus to remove or insert such an IC pack from or into a socket, a great deal of time consuming care must be taken to prevent pin damage.

A number of commercially available devices solve this problem by extracting or inserting the IC's in a controlled, uniform manner in order to minimize pin deformation. These devices, however, are generally large, complex, cumbersome, difficult to manufacture and thus expensive. Typical devices are shown in U.S. Pat. Nos. 4,172,317 and 4,215,468. Another disadvantage of commercially available devices is that each is designed to perform just one function, e.g. either extract or insert an IC but not perform both functions.

DISCLOSURE OF THE INVENTION

In accordance with the present invention, we provide a tool for insertion and extraction of an IC pack to an from a socket, which tool includes two flexible, parallel arms extending from a "U" shaped portion. The free ends of each arm have projections extending towards the opposite arm adapted to grip the IC pack at its opposite ends when the arms are moved towards each other. A rocking motion applied to the IC loosens its pins within the socket and combined with a lifting force removes it from the socket.

The tool further includes a plunger having a substantially rectangular base which is positioned and is free to move between the two parallel walls of the "U" portion. An IC pack to be inserted into a socket is positioned between the two parallel walls with the pins at opposite sides of the IC pack pointing downward and the surface of the IC pack opposite the pins mating with the base of the plunger. The IC pack is retained within the "U" portion by an interference fit between the walls and the IC pack and the pins at opposite sides of the IC pack are deflected by the walls to a distance apart corresponding to distance separating corresponding openings in the socket. The tool positions the IC pack over the socket and a downward force applied to the plunger pushes the IC pack out of the "U" portion until all the pins of the IC pack are seated within the socket.

THE DRAWING

DETAILED DESCRIPTION

Figure 1:
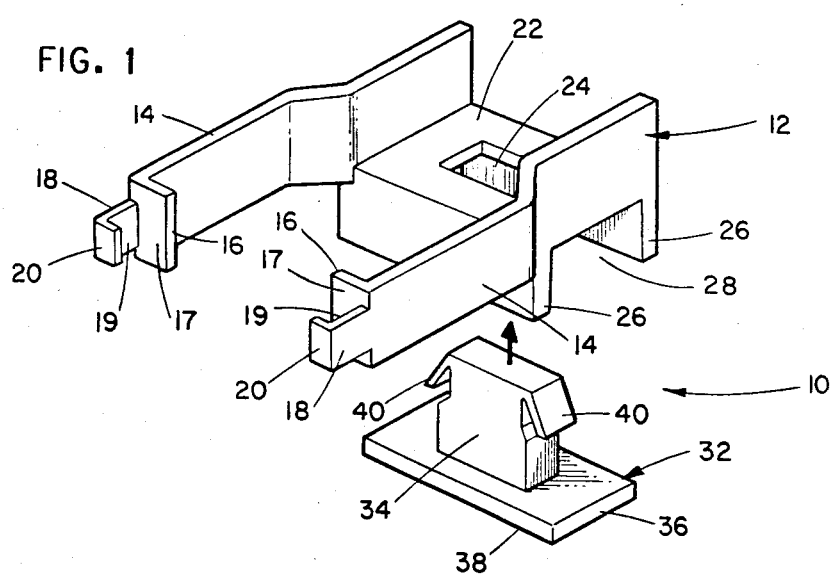
FIG. 1 is an exploded perspective view of the insertion/extraction tool before assembly.
Figure 2:
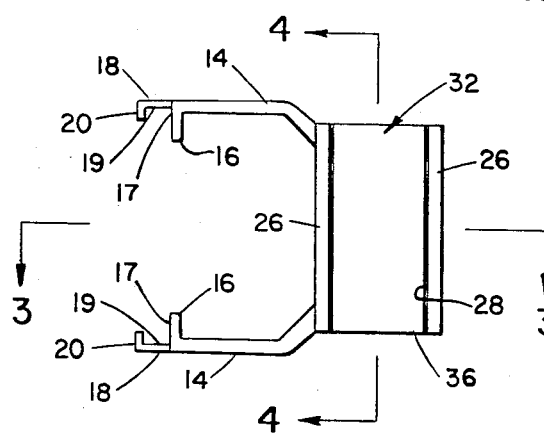
FIG. 2 is a bottom plan view of the assembled tool shown in FIG. 1.
Figure 3:
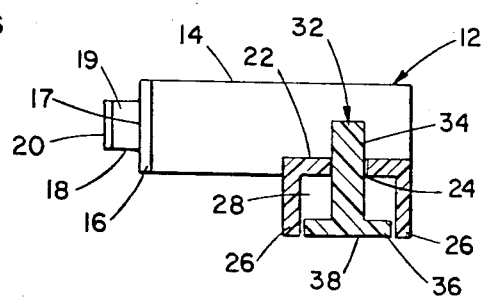
FIG. 3 is a sectional view taken along line 3—3 of FIG. 2.
Figure 4:
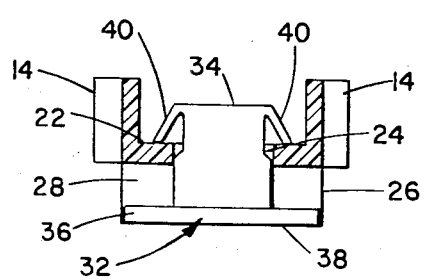
FIG. 4 is a sectional view taken along line 4—4 of FIG. 2.
Figure 5:
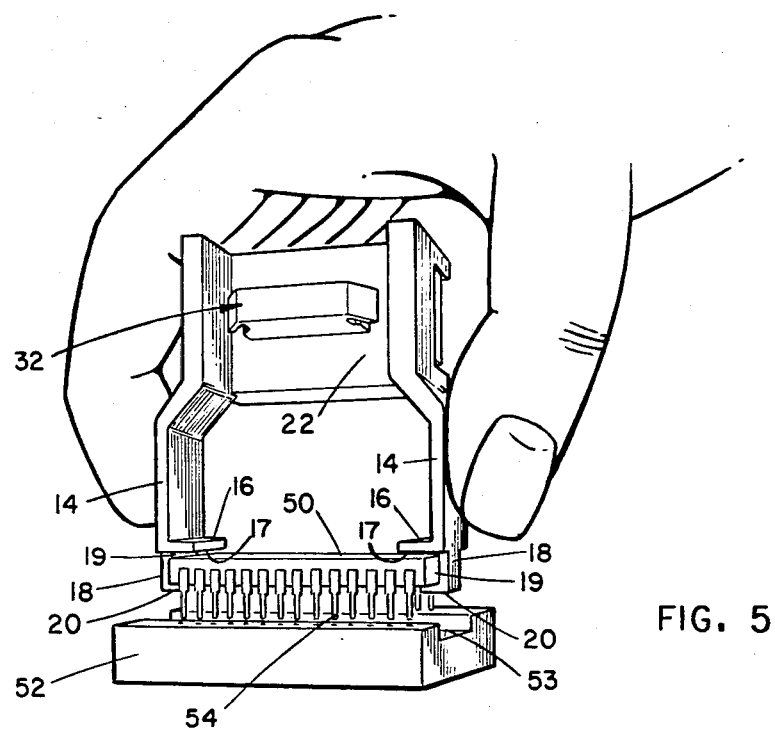
FIG. 5 is a perspective view of the tool illustrating the manner in which the tool is used to extract an IC pack from a socket.
Figure 6:
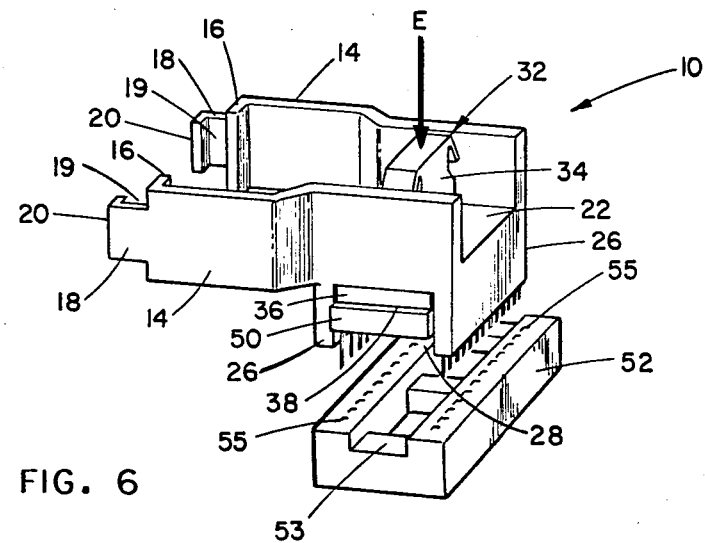
FIG. 6 is a perspective view illustrating the manner in which the tool is used to insert an IC pack into a socket.

Referring now to the drawing in detail and specifically to FIG. 1, there is shown an exploded perspective view of a tool 10 for inserting and extracting an IC pack 50 to and from a socket 52 (shown in FIGS. 5 and 6). Tool 10, shown in FIG. 1 before assembly, has a main body portion 12 and a plunger portion 32. Both the body 12 and the plunger 32 may be manufactured by an injection molding process from a thermal setting type of plastic material. When body 12 and plunger 32 are assembled, as shown in FIGS. 2, 3 and 4, the plunger 32 becomes an integral part of the body 12.

The main body portion 12 has a pair of flexible, parallel arms 14 extending from a bridge portion 22 joining the two arms. The two arms 14 are each a mirror image of 5 the other and each has inwardly directed projections 16 and 20. Projections 16 and 20 are parallel to each other and are located a distance apart which is greater than the height of the IC pack 50 to be removed. Projection 16 is approximately twice as long as projection 20 and has a flat surface 17 which is the width of the IC pack and is adjacent to projection 20. The width and thickness of projection 20 is such that it is accomodated by an opening 53 which exists between the ends of the IC pack 50 and its socket 52. The bridge portion 22 has a rectangular aperture 24 and a pair of opposed wall portions 28 extending downward, the wall portions 28 and the bridge 22 forming a "U" shaped opening 28.

The plunger 32 has a rectangular base 36 adapted to slidably move within the "U" shaped opening 28. A rectangular stem 34 extends from one of the major surfaces of the base 36 and is adapted to slidably move within the aperture 24. The free end of the stem 34 terminates in a rectangular section which has a smaller cross section than the stem portion attached to the base 36. A pair of flexible tabs 40 extend in an out and downward sloping direction from two sides of the free end of the stem 34 past the base of the stem 34.

Assembly of the tool 10 is accomplished by inserting the stem portion 34 of the plunger 32 into the aperture 24 as illustrated in FIG. 1. Tabs 40 when in normal rest position extend beyond the elongated aperture 24, as shown in FIG. 4. Since the tabs are flexible, during the insertion of the stem 34 into the aperture 24 tabs 40 are compressed inward toward the center line of stem 34 allowing the free end of the stem 34 to pass through the aperture 24 and then for the remainder of the stem to enter the aperture 24. Once the tabs 40 pass through the aperture 24, they spring back to their normal rest position retaining stem 34 in the aperture 24. The stem 34 is of a length such that when the tabs 40 contact the bridge portion 22, as shown in FIGS. 3 and 4, the bottom surface 38 of the base 36 is substantially flush with the free ends of the wall portions 26. The distance between the opposing walls 26 is slightly greater than the width of the base 36 allowing plunger 32 free movement within the "U" shaped opening.

FIG. 5 illustrates the manner in which tool 10 is used to remove the IC pack 50 having a plurality of pins 54 located at opposite sides of the pack from the socket 52 which is secured to a circuit board (not shown). Socket 52 has a plurality of openings 55 located along each side of the socket arranged to accomodate the pins 54. The flat portions 17 of projections 16 of arms 14 are placed on the upper surface of the IC pack 50 at both ends. By applying a force by two fingers of a hand, the arms 14 are moved towards each other until surfaces 19 of fingers 18 firmly engage both ends of the IC pack 50. During this time, projections 20 enter openings 53 located between the IC pack 50 and the socket 52 engaging the bottom surface of the IC pack 50. Once this is accomplished, a slight back and forth rocking motion is initiated about the major axis of the IC pack. The rocking motion loosens the pins of the IC pack 50 within the socket 52, and once the pins have been loosened, a straight upward pulling motion extracts the IC pack 50 from the socket 52.

FIG. 6 illustrates a method for inserting the IC pack 50 into the socket 52. Initially, the IC pack 50 is placed in the "U" shaped portion 28 until it is fully seated against the surface 38 of the base 36 of the plunger 32 with the pins of the pack projecting outwardly. The space between the walls 26 of the "U" shaped portion 28 is determined by the size of an IC pack which tool 10 is designed to accomodate. The spacing is such that when an IC pack is placed in the "U" shaped portion, there is sufficient friction between the IC pack and walls 26 to retain the IC pack within the "U" shaped portion 28 until a force F is applied to plunger 32 to overcome the frictional holding force. The height of the walls 26 is such that when the IC pack 50 is within the "U" in contact with base 36, and the base 36 is pushed against the bridge section 22, a major portion of pins 54 are within the "U" shaped opening. The pins 54 are thereby aligned parallel to the walls 26 and the distance between the pins 54, located at opposite sides of the IC pack 50, is substantially equal to the distance between openings 55 located along each side of socket 52. between openings 55 located along each side of socket 52. The tool 10 is placed over the socket 52 aligning the pins 54 of the IC pack 50 with corresponding openings 55 in the socket 52. Force F is then applied to stem 34 of the plunger 32 in the direction of arrow until the pins 54 of the IC device 50 are fully seated in their respective openings 55 of the socket 52.

What is claimed is:

1. A tool for inserting an IC pack, having a plurality of pins extending from one of its surfaces, into a socket having a plurality of openings adapted to receive the pins, and for extracting the IC pack from the socket, the tool comprising:
    means for inserting the IC pack into the socket including:
    a "U" shaped portion;
    a plunger having a substantially rectangular base slidably mounted within the "U" shaped portion;
    the "U" shaped portion adapted to accept the IC pack between the two walls and retain it by frictional force between the walls and the IC pack, which is inserted into the "U" shaped portion with the pins pointing outward and the surface of the IC pack opposite the pins in contact with the base;
    means for moving the base to push the IC pack out of the "U" shaped portion and into the socket; and
    means for extracting the IC pack from the socket including:
    a pair of flexible, parallel arms extending from said "U" shaped portion, each arm a mirror image of the other; and
    means located at the free end of each of the arms for gripping the IC pack at opposite ends thereby enabling a rocking motion to be applied to the IC pack to loosen the pins in the socket and then for a lifting force to be applied to extract the IC pack from the socket.

2. A tool in accordance with claim 1 wherein the means for moving the base includes:
    a stem having a substantially uniform cross section extending from one of the major surfaces of the base;
    the "U" shaped portion having an aperture adapted to slidably accept the stem; and
    means for retaining the stem within the aperture.

3. A tool in accordance with claim 2 wherein the means of retaining the stem within the aperture in the "U" includes:
    the stem portion having a free end with a cross section which is substantially smaller than the cross section of the remainder of the stem;
    a pair of flexible tabs extending in an out and downward direction from the free end of the stem such that when the free end of the stem is inserted into the aperture in the "U", the tabs are pushed towards the center line of the stem allowing the free end to pass through the opening and allow the remainder of the stem to enter the aperture, and wherein the tabs after passing through the aperture, spring back to their normal position extending over the edges of the aperture and thus retain the stem within the aperture.

4. A tool for inserting an IC pack, having a plurality of pins extending from one of its surfaces, into a socket having a plurality of openings adapted to receive the pins, and for extracting the IC pack from the socket, the tool comprising:
    means for inserting the IC pack into the socket including:
    a "U" shaped portion;
    a plunger having a substantially rectangular base slidably mounted within the "U" shaped portion;
    the "U" shaped portion adapted to accept the IC pack between the two walls and retain it by frictional force between the walls and the IC pack, which is inserted into the "U" shaped portion with the pins pointing outward and the surface of the IC pack opposite the pins in contact with the base;
    means for moving the base to push the IC pack out of the "U" shaped portion and into the socket including:
    a stem having a substantially uniform cross section extending from one of the major surfaces of the base;
    the "U" shaped portion having an aperture adapted to slidably accept the stem;
    means for retaining the stem within the aperture including:
    the stem portion having a free end with a cross section which is substantially smaller than the cross section of the remainder of the stem;
    a pair of flexible tabs extending in an out and downward direction from the free end of the stem such that when the free end of the stem is inserted into the aperture in the "U", the tabs are pushed toward the center line of the stem allowing the free end to pass through the opening and allow the remainder of the stem to enter the aperture, and wherein the tabs after passing through the aperture, spring back to their normal position extending over the edges of the aperture and thus retain the stem within the aperture; and means for extracting the IC pack from the socket.

5. A tool in accordance with claim 4 wherein the means for extracting the IC pack from the socket includes:

a pair of flexible, parallel arms extending from said "U" shaped portion, each arm a mirror image of the other; and means located at the free end of each of the arms for gripping the IC pack at opposite ends thereby enabling a rocking motion to be applied to the IC pack to loosen the pins in the socket and then for a lifting force to be applied to extract the IC pack from the socket.

6. A tool in accordance with claim 1 or 5 wherein the means for gripping the IC pack includes:

a first projection extending from the free end of each arm towards the opposite arm;

a second projection parallel to the first projection and a predetermined distance away from the first projection extending a distance farther than the first projection towards the other arm, wherein the second projection has a surface adapted to contact the surface of the IC pack located opposite the surface having the pins extending therefrom, and the first projection is adapted to contact the surface from which the pins extend.

* * * * *